United States Patent
Bai et al.

(10) Patent No.: US 6,528,856 B1
(45) Date of Patent: Mar. 4, 2003

(54) HIGH DIELECTRIC CONSTANT METAL OXIDE GATE DIELECTRICS

(75) Inventors: Gang Bai, San Jose, CA (US); David B. Fraser, Danville, CA (US); Brian S. Doyle, Cupertino, CA (US); Peng Cheng, Campbell, CA (US); Chunlin Liang, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/212,773

(22) Filed: Dec. 15, 1998

(51) Int. Cl.[7] ............................................. H01L 29/76
(52) U.S. Cl. ...................... 257/411; 257/410; 438/287; 438/591
(58) Field of Search ................. 257/310, 405, 257/410, 411; 438/216, 287, 591

(56) References Cited

U.S. PATENT DOCUMENTS

| 4,743,953 A | * | 5/1988 | Toyokura et al. | ........... 257/310 |
| 5,134,451 A | * | 7/1992 | Katoh | ........................ 257/384 |
| 5,272,361 A | * | 12/1993 | Yamazaki | .................... 257/66 |
| 5,923,056 A | * | 7/1999 | Lee et al. | ................... 257/192 |
| 5,937,303 A | * | 8/1999 | Gardner et al. | ............. 438/305 |
| 6,020,024 A | * | 2/2000 | Maiti et al. | ............... 427/248.1 |

FOREIGN PATENT DOCUMENTS

JP         3-53-113484    * 10/1978    ........... H01L/29/78

* cited by examiner

Primary Examiner—George Eckert
(74) Attorney, Agent, or Firm—Blakely, Sokoloff, Taylor & Zafman LLP

(57) ABSTRACT

A method of forming a dielectric layer suitable for use as the gate dielectric layer of a metal-oxide-semiconductor field effect transistor (MOSFET) includes oxidizing the surface of a silicon substrate, forming a metal layer over the oxidized surface, and reacting the metal with the oxidized surface to form a substantially intrinsic layer of silicon superjacent the substrate, wherein at least a portion of the silicon layer may be an epitaxial silicon layer, and a metal oxide layer superjacent the silicon layer. In a further aspect of the present invention, an integrated circuit includes a plurality of MOSFETs, wherein various ones of the plurality of transistors have metal oxide gate dielectric layers and substantially intrinsic silicon layers subjacent the metal oxide dielectric layers.

26 Claims, 3 Drawing Sheets

HIGH DIELECTRIC CONSTANT METAL OXIDE GATE DIELECTRICS

BACKGROUND OF THE INVENTION

1. Field of the Invention

The present invention relates generally to semiconductor structures and manufacturing. More particularly the invention relates to the formation of metal oxide gate dielectric layers for metal-oxide-semiconductor field effect transistors (MOSFETs).

2. Background

Advances in semiconductor manufacturing technology have led to the integration of millions of circuit elements, such as transistors, on a single integrated circuit (IC). In order to integrate increasing numbers of circuit elements onto an integrated circuit it has been necessary to reduce the line widths of the various parts that make up an integrated circuit. Not only have interconnect line widths become smaller, but so have the dimensions of metal-oxide-semiconductor field effect transistors.

MOSFETs are also sometimes referred to as insulated gate field effect transistors (IGFETs). Most commonly, these devices are referred to simply as FETs, and are so referred to herein.

Transistor scaling typically involves more than just the linear reduction of the FET width and length. For example, both source/drain (S/D) junction depth and gate dielectric thickness are also typically reduced in order to produce a FET with the desired electrical characteristics. Similarly, when in use, these reduced scale FETs are operated with scaled down voltages.

Over the years, a substantial amount of research and development in the field of semiconductor manufacturing has been dedicated to providing reduced thickness dielectric layers, as mentioned above. However, to be suitable for use as a MOSFET gate dielectric layer, these reduced thickness dielectric layers are typically required to have certain characteristics. For example, the dielectric layer should have a low density of interface states, a low density of defects, and a dielectric breakdown voltage high enough for use with the desired voltages that the MOSFET will encounter during operation.

What is needed is a thin dielectric layer suitable for use as the gate dielectric layer in a MOSFET, and what is further needed are methods of making such a dielectric layer.

SUMMARY OF THE INVENTION

Briefly, a method of forming a dielectric layer suitable for use as the gate dielectric layer of a MOSFET includes oxidizing the surface of a silicon substrate, forming a metal layer over the oxidized surface, and reacting the metal with the oxidized surface to form an at least partially epitaxial silicon layer superjacent the substrate, and a metal oxide layer superjacent the epitaxial silicon layer.

In a further aspect of the present invention, an integrated circuit includes a plurality of insulated gate field effect transistors, wherein various ones of the plurality of transistors have metal oxide gate dielectric layers and substantially intrinsic silicon layers subjacent the metal oxide dielectric layers.

DETAILED DESCRIPTION

Terminology

Figure 1:
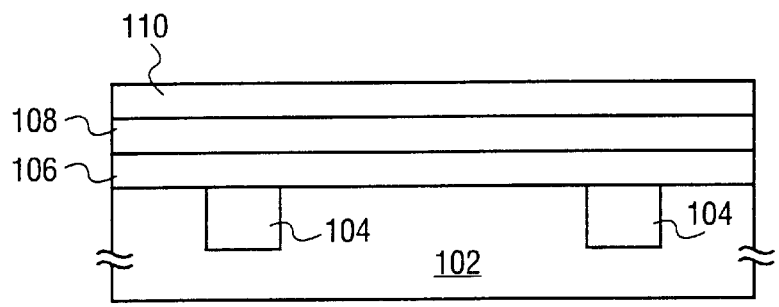
FIG. 1 is a schematic cross-sectional view of a wafer with a first oxide layer formed on the surface thereof, a metal layer formed over the oxide layer and a capping layer formed over the metal layer.

The terms, chip, integrated circuit, monolithic device, semiconductor device, and microelectronic device, are often used interchangeably in this field. The present invention is applicable to all the above as they are generally understood in the field.

Historically, the material most commonly used in the semiconductor industry to form the gate insulator layer of a FET is silicon dioxide. Thus, the gate insulator layer is frequently referred to simply as the gate oxide. The expression gate dielectric is also used to describe the gate insulator layer.

The term "gate" is context sensitive and can be used in two ways when describing integrated circuits. Gate refers to a circuit for realizing an arbitrary logical function when used in the context of a logic gate. However, as used herein, gate refers to the insulated gate terminal of a three terminal FET when used in the context of transistor circuit configurations or formation of transistor structures. The expression "gate terminal" is generally interchangeable with the expression "gate electrode". A FET can be viewed as a four terminal device when the semiconductor body is considered. However, for the purpose of describing illustrative embodiments of the present invention, the FET will be described using the traditional gate-drain-source, three terminal model.

Polycrystalline silicon is a nonporous form of silicon made up of randomly oriented crystallites or domains. Polycrystalline silicon is often formed by chemical vapor deposition from a silicon source gas or other methods and has a structure that contains large-angle grain boundaries, twin boundaries, or both. Polycrystalline silicon is often referred to in this field as polysilicon, or sometimes more simply as poly.

The expression, high dielectric constant materials, refers to materials having a higher dielectric constant than oxides of silicon. Similarly, the expression low dielectric constant materials refers to materials having a lower dielectric constant than oxides of silicon.

The letter k, is often used to refer to dielectric constant. Similarly, the terms high-k, and low-k, are used in this field to refer to high dielectric constant and low dielectric constant respectively.

Source/drain terminals refer to the terminals of a FET, between which conduction occurs under the influence of an electric field, subsequent to the inversion of the semiconductor surface under the influence of a electric field resulting from a voltage applied to the gate terminal. Generally, the source and drain terminals are fabricated such that they are geometrically symmetrical. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminal when the FET is operated in a circuit.

Overview

A silicon dioxide layer is reacted with an overlying metal layer to produce a silicon layer and a metal oxide layer. The metal oxide layer is suitable for use as a gate insulator layer of a MOSFET. In typical embodiments of the present invention, a silicon dioxide layer is thermally grown on the surface of a silicon substrate, and a metal layer is deposited over the silicon dioxide layer. Preferably, the metal is one that does not form a silicide. Such metals include, but are not limited to, hafnium and zirconium. The metal layer and the silicon dioxide layer are reacted to form a silicon layer and an overlying metal oxide layer. In a first embodiment of the present invention, a capping layer is formed over the metal prior to the metal being reacted with silicon dioxide. In an alternative embodiment, the metal and silicon dioxide are reacted without a capping layer over the metal.

It has long been known that electrical characteristics of MOSFETs, for example, threshold voltage, are a function of the gate insulator thickness and the dielectric constant of the gate insulator material. In the case of the threshold voltage, for example, the threshold voltage is approximately proportional to the thickness of the gate insulator layer, and further is approximately inversely proportional to the dielectric constant of the material which comprises the gate dielectric layer. From this relationship, it can be seen that a desired change in an electrical characteristic such as threshold voltage can be achieved by manipulating the thickness or the dielectric constant of the gate insulator, or both. Another way to view this is to recognize that, electrically, a thin dielectric layer having a first dielectric constant, can be equivalent to a thicker dielectric layer having a dielectric constant greater than the first dielectric constant.

The relationship between gate dielectric thickness and dielectric constant takes on particular significance in the design and fabrication of deep submicron MOSFETs. Given the dielectric constant of silicon dioxide, the traditional, and most common gate dielectric material, a thickness below about 1 nm (i.e., 10 angstroms) is required for fabricating MOSFETs with desired electrical characteristics. These extremely thin dielectric layers are difficult to fabricate and further may be sensitive to mechanical stresses, or tunneling phenomenon. However, a thicker, more robust dielectric layer, made from a material with a greater dielectric constant than that of silicon dioxide, can be used to enable transistor scaling beyond (i.e., below) channel lengths of 0.1 micron.

Several high-k gate insulators, such as $TiO_2$, and $Ta_2O_5$, are currently formed by depositing such thin films on a silicon surface by chemical vapor deposition. However, this type of deposition operation has at least two very stringent requirements. First, that the initial silicon surface is atomically clean without any native $SiO_2$. This is critical to achieving equivalent $SiO_2$ thicknesses less than 1.0 nm. Second, that the deposition and any post deposition thermal operations do not produce any $SiO_2$ interfacial layer. These are requirements with which it is difficult to comply.

Figure 2:
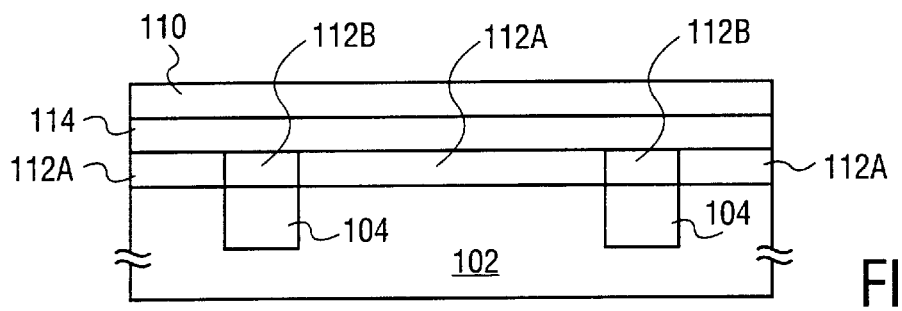
FIG. 2 is a schematic cross-sectional view of the structure of FIG. 1, after the first oxide layer is converted to a metal oxide layer and a silicon layer is formed.
Figure 3:
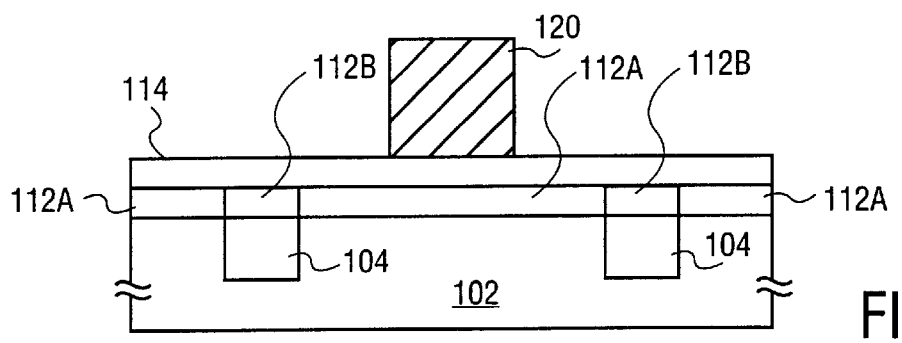
FIG. 3 is a schematic cross-sectional view of the structure of FIG. 2, after the capping layer has been removed and a gate electrode has been patterned over the metal oxide layer.
Figure 4:
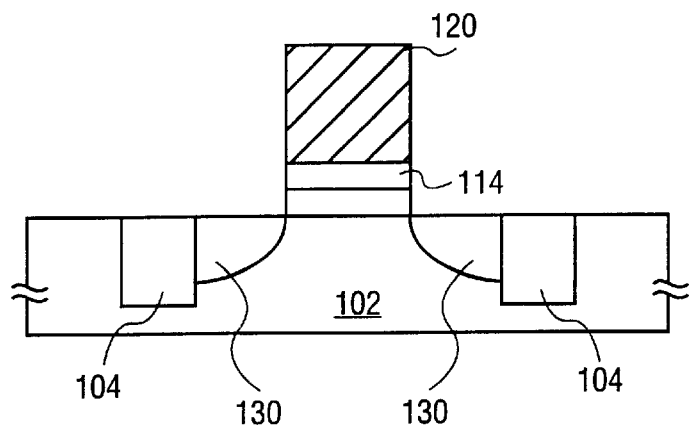
FIG. 4 is a schematic cross-sectional view of the structure of FIG. 3, after further processing operation to form source/drain terminals in the wafer.
Figure 5:
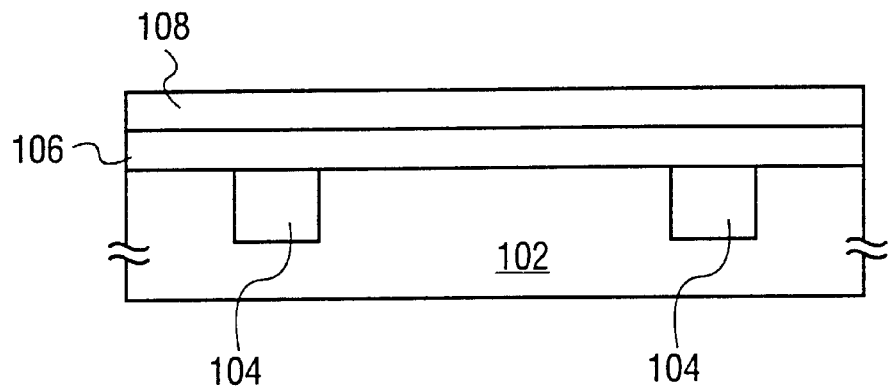
FIG. 5 is a schematic cross-sectional view of a wafer with a first oxide layer formed on the surface thereof, and a metal layer formed over the first oxide layer.
Figure 6:
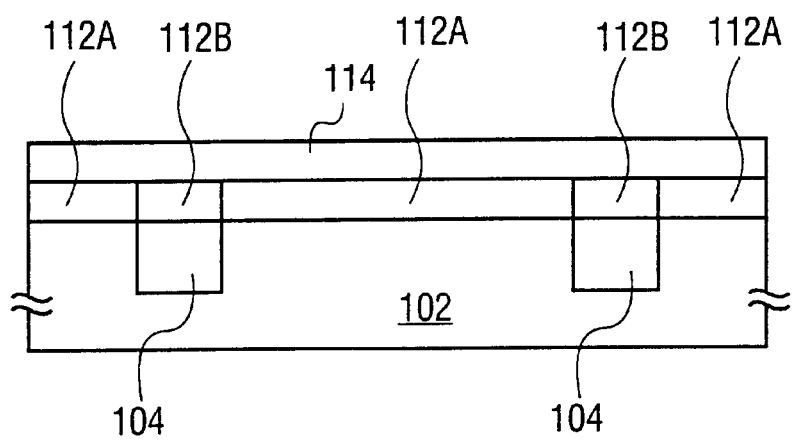
FIG. 6 is a schematic cross-sectional view of the structure of FIG. 5, after the first oxide layer is converted to a metal oxide layer and a silicon layer is formed.

Various illustrative embodiments of the present invention are described below with reference to FIGS. 1–8. FIGS. 1–2 illustrate the various stages of fabrication of a metal oxide dielectric layer over an silicon layer. Portions of this silicon layer include intrinsic epitaxial silicon. FIGS. 3–4 illustrate various stages of fabrication of a field effect transistor having a metal oxide layer as a gate dielectric and an epitaxial silicon layer underlying the metal oxide that forms the gate insulating layer. FIGS. 5–6 illustrate an alternative process embodiment of the present invention wherein a metal oxide layer overlying at least one epi-Si region is formed without the use of a capping layer over the metal.

Referring now to FIG. 1, a cross-sectional view of a substrate is shown wherein a silicon substrate 102 has a shallow trench isolation structure 104 disposed therein, a silicon dioxide layer 106 disposed on the surface of substrate 102, a metal film 108 disposed over silicon dioxide layer 106, and a capping layer 110 disposed over metal film 108.

Shallow trench isolation structure 104 is typically filled with a dielectric material such as silicon dioxide. Those skilled in the art will recognize that although shallow trench isolation structures are common in modern integrated circuits, such a structure is not required to practice the present invention.

Silicon dioxide layer 106 is typically formed by a thermal oxidation operation, and such operations are well known in this field. Silicon dioxide layer 106 has a thickness in the range of 5 angstroms to 100 angstroms. Those skilled in the art will appreciate that even though layer 106 is referred to as a silicon dioxide layer, such an extremely thin oxide layer may contain some number of dangling, or untied bonds, and so this layer may also more generically be referred to as an oxide of silicon. Metal film 108 is then deposited onto the surface of silicon dioxide layer 106. Any suitable metal may be used that can be converted to a metal oxide by reaction with silicon dioxide. It is preferable that the metal selected for metal film 108 is a metal that does not react with silicon to form a silicide. It is also preferable that the metal selected for metal film 108 has a higher heat of formation than silicon dioxide. Some of the rare earth elements are suitable for use as metal film 108. In this illustrative embodiment of the present invention, hafnium is used for metal film 108. Zirconium is another material that can be used for metal film 108. A typical range of thicknesses for metal film 108 is approximately 100 angstroms to 200 angstroms. A capping layer 110 is formed over metal film 108 to substantially prevent interaction of metal film 108 with the ambient environment. Capping layer 110 may be any suitable material that prevents interaction of metal film 108 with the ambient. An additional desirable characteristic of capping layer 110 is that it is substantially unreactive with metal film 108. In the illustrative embodiment, capping layer 110 is a titanium nitride (TiN) film formed by a physical vapor deposition operation. A typical thickness for capping layer 110 is approximately 200 angstroms, but in any case capping layer 110 should be thick enough to prevent interaction of metal film 108 with the ambient environment.

Since, in this embodiment, the reaction of metal film 108 and oxide layer 106 will be limited by the amount of material in oxide layer 106, the thickness of metal film 108 is typically chosen such that oxide layer 106 is substantially completely converted.

In accordance with the present invention, FIG. 2 shows a schematic cross-sectional view of the structure of FIG. 1, after silicon dioxide layer 106 is converted to metal oxide layer 114 by a thermal annealing operation, typically at a temperature above approximately 600° C. This annealing operation facilitates the reaction $SiO_2+Hf\rightarrow Si(epi)+HfO_2$. The temperature selected for the thermal annealing operation is typically chosen to be, but is not limited to, approximately one-half of the melting temperature of the metal film. The silicon produced in this reaction is substantially intrinsic and is shown in FIG. 2 as layers 112a and 112b. Layer 112a represents the substantially intrinsic silicon that forms an epitaxial layer over the surface of silicon substrate 102. Layer 112b represents non-epitaxial silicon that may form over STI structures 104. Alternatively, in those regions where there is an underlying STI structure, silicon formed by the reaction of the metal with the silicon dioxide may rise to the top of the metal oxide layer rather than forming underneath the metal oxide. In any case, when silicon is formed immediately overlying the STI regions, that silicon is removed so as to prevent electrical shorting between the regions separated by the STI structures. Any silicon that is formed over the STI structures is removed prior to forming a silicide over the surface of the source/drain terminals.

The re-grown epi-Si layer is substantially intrinsic. Those skilled in the art will appreciate that having an intrinsic layer immediately subjacent the gate dielectric layer may provide the additional benefit of enhanced carrier mobility in a MOSFET fabricated in this way. In one embodiment of the present invention, the silicon layer formed by the reaction of the silicon dioxide with the metal film may have a thickness in the range of about 10 angstroms to 20 angstroms.

Referring now to FIG. 3, the structure of FIG. 2 is shown after capping layer 110 is removed by etching; excess (i.e., unreacted) metal 108 is removed; and after the formation of a gate electrode 120. Typically capping layer 110 is removed by a wet etch process. When TiN is used as capping layer 110, sulfuric acid or ammonium hydroxide may be used to remove the capping layer. Gate electrode 120 is disposed over metal oxide layer 114. Conventional processing operations are used to form gate electrode 120.

FIG. 4 shows a cross-sectional view of a MOSFET that includes patterned metal oxide layer 114 as a gate insulating layer. The MOSFET also includes a gate electrode 120 disposed over metal oxide 114, and source/drain terminals 130 disposed, substantially adjacent gate electrode 120, as shown in FIG. 4. Those skilled in the art will recognize that many variations on this structure are possible within the scope of the present invention. For example, sidewall spacers are often formed adjacent to the gate electrode of MOSFETs so as to aid in the control of source/drain terminal formation. Methods for the formation of gate electrodes, sidewall spacers, and source/drain terminals are well known in this field. Various known materials and dimensions may be selected for the gate electrodes, sidewall spacers and source/drain terminals. Typical materials may include, but the present invention is not limited to, polysilicon for the gate electrode, silicon nitride for the sidewall spacers, and p-type dopants such as boron to form the source/drain terminals of p-channel MOSFETs and n-type dopants such as arsenic or phosphorous to form the source/drain terminals of n-channel MOSFETs. Similarly, well-known deposition, and patterning methods may be used to form the MOSFET structure of FIG. 4.

An alternative embodiment of the present invention does not require a capping layer over the metal film, but rather requires an in-situ thermal annealing in a high vacuum. This alternative embodiment is described in conjunction with FIGS. 5–6.

Referring now to FIG. 5, a cross-sectional view of a substrate is shown wherein a silicon substrate 102 has shallow trench isolation structures 104 disposed therein, a silicon dioxide layer 106 disposed on the surface of substrate 102, and a metal film 108 disposed over silicon dioxide layer 106.

Shallow trench structure 104 is typically filled with a dielectric material such as silicon dioxide. Those skilled in the art will recognize that although shallow trench isolation structures are common in modern integrated circuits, such a structure is not required to practice the present invention.

Silicon dioxide layer 106 is typically formed by a thermal oxidation operation, and such operations are well-known in this field. Silicon dioxide layer 106 has a thickness in the range of 5 angstroms to 100 angstroms. Metal film 108 is then deposited onto the surface of silicon dioxide layer 106. Any suitable metal may be used that can be converted to a metal oxide by reaction with silicon dioxide. It is preferable that the metal selected for metal film 108 is a metal that does not react with silicon to form a silicide. In this illustrative embodiment of the present invention, hafnium is used for metal film 108. Zirconium is another material that can be used for metal film 108. A typical range of thicknesses for metal film 108 is approximately 100 angstroms to 200 angstroms. The thickness of metal film 108 is generally chosen such that there is an adequate supply of the metal to substantially completely react with the underlying silicon dioxide layer. Typically, metal film 108 is deposited by a physical vapor deposition (PVD) process. Those skilled in the art will recognize that a PVD process is one in which a material is deposited directly from a target to a wafer, rather than being created as a reaction product and then deposited. A typical PVD process for rare earth metal deposition includes igniting a plasma formed from a gas that is inert, i.e., unreactive with the rare earth metal target, in a reaction chamber under high vacuum conditions. Argon is an example of such an inert gas. Various other PVD parameters and ranges will be apparent to those skilled in the art.

In accordance with the present invention, FIG. 6 shows a schematic cross-sectional view of the structure of FIG. 5, after silicon dioxide layer 106 is converted to metal oxide layer 114 by heating without breaking vacuum from the PVD operation. This heating operation promotes the reaction $SiO_2+Hf\rightarrow Si+HfO_2$. In one embodiment there is a minimal, i.e., very small amount, of $SiO_2$ on the substrate, and the remainder of the oxygen necessary to form metal oxide layer 114 comes from an oxidizing ambient. For example, the reaction that forms metal oxide 114 could be done in a reduced pressure chamber with partial $O_2$ in the ambient. Such a process would substantially preclude the possibility of unreacted $SiO_2$ left at the interface between the substrate and the metal oxide layer.

As shown in FIGS. 5–6, an epi-Si layer 112a is formed where the single crystal silicon of substrate 102 underlies silicon dioxide layer 106. However, a silicon layer 112b is formed over the dielectric-filled shallow trench isolation structures 104. Silicon layer 112b typically is not crystalline. Alternatively, silicon layer 112b might not be formed, but rather, in the reaction between the silicon dioxide and the metal film, a silicon layer may form over the metal oxide layer in those regions where there is an underlying STI region. In any case, when silicon is formed immediately overlying the STI regions, that silicon is removed so as to prevent electrical shorting between the regions separated by the STI structures. Any silicon that is formed over the STI structures is removed prior to a forming a silicide over the surface of the source/drain terminals.

The re-grown epi-Si layer 112a is substantially intrinsic. That is, re-grown epi-Si layer 112a is substantially free of dopant atoms. Those skilled in the art will appreciate that having an intrinsic layer immediately subjacent the gate dielectric layer may provide the additional benefit of enhanced carrier mobility in a MOSFET fabricated in this way. Typically, layer 112a is thin enough such that a MOSFET threshold voltage is substantially determined by the doping concentrations of substrate 102.

Once metal oxide layer 114 is formed, and excess, unreacted metal is removed, conventional processing operations may be performed so as to complete a MOSFET structure as described above in connection with FIGS. 3–4.

Figure 7:
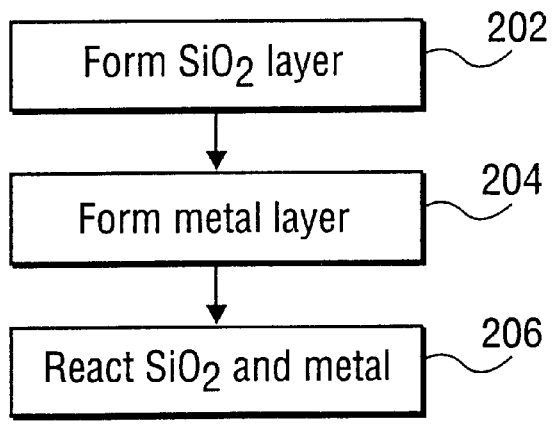
FIG. 7 is a flow diagram illustrating a process in accordance with the present invention.

FIG. 7 is a flow diagram illustrating a process embodying the present invention. As shown in FIG. 7, at block 202, a layer of silicon dioxide is formed on the surface of a wafer. A metal layer is then deposited 204 over the silicon dioxide layer. Metal deposition is typically achieved by physical vapor deposition. The metal is preferably one that does not form a silicide with silicon, but one that does form a metal oxide when reacted with silicon dioxide. Hafnium and zirconium are examples of such materials that are suitable for use in forming a metal layer. The silicon dioxide and metal layer are reacted 206 to form a metal oxide layer and a silicon layer. In some embodiments, the metal may be covered by a capping layer (e.g., a TiN layer) to prevent its interaction with the reaction ambient. In other embodiments, no capping layer is used, but rather the wafer is heated without breaking the vacuum that was formed in the reaction chamber for the metal deposition operation.

Figure 8:
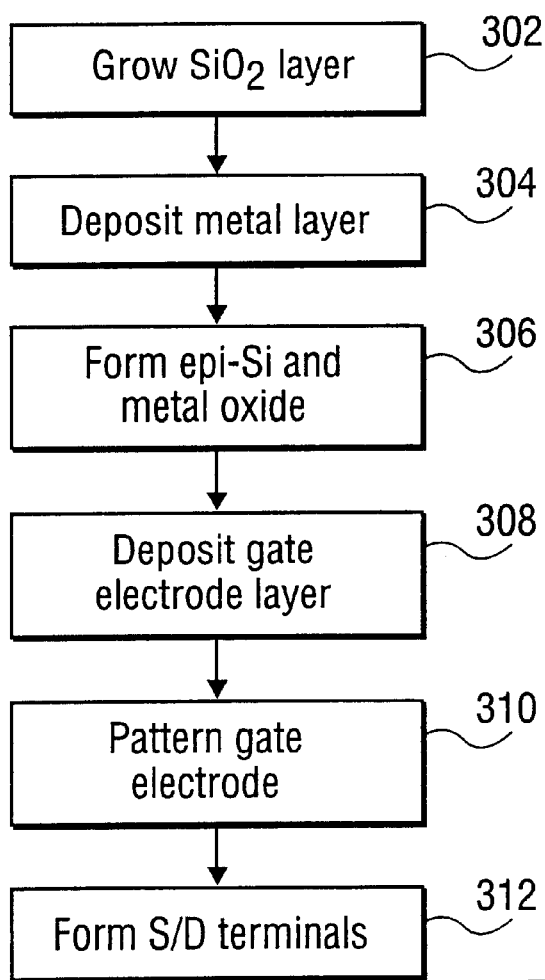
FIG. 8 is a flow diagram illustrating a process in accordance with the present invention.

FIG. 8 is a flow diagram illustrating a process embodying the present invention. As shown in FIG. 8, at block 302, a layer of $SiO_2$ is grown on the surface of a silicon wafer by thermal oxidation. A metal layer is deposited 304 over the $SiO_2$ layer. The metal layer and the $SiO_2$ are reacted, generally by heating, to form 306 a silicon layer and a metal oxide layer. More particularly, the silicon layer tends to be intrinsic silicon. Furthermore, the silicon layer tends to be a crystalline silicon layer in those portions of the wafer where the $SiO_2$ layer was superjacent crystalline silicon of the wafer. If a capping layer was applied over the metal prior to reacting the metal with the $SiO_2$, then the capping layer is removed, along with the unreacted metal, if any. A layer of material is from which a gate electrode may be patterned is then deposited 308. The gate electrode is patterned 310, and source/drain terminals are formed 312. Those skilled in the art will appreciate that well-known materials and processing operations may be used to form the gate electrode and source/drain terminals, once the metal oxide layer has been formed. For example, polysilicon may be used to form the gate electrode and the source/drain terminals may be formed by implanting n-typed or p-type dopants substantially adjacent to the gate electrode. Sidewall spacers may be formed adjacent to the gate electrode prior to the formation of the source/drain terminals.

Various other layers of insulators and conducting material are formed above the gate level, as is well understood in the field of semiconductor manufacturing and integrated circuit design.

CONCLUSION

Embodiments of the present invention provide metal oxide dielectric layers that are suitable for use as the gate insulator layer for a MOSFET.

Methods in accordance with the present invention take advantage of the ready formation of $SiO_2$ on the surface of a silicon substrate, and convert the $SiO_2$ layer to a high-k metal oxide suitable for use a gate dielectric layer by reacting with a thin metal film, typically, by thermal annealing.

In a further aspect of the present invention, a MOSFET is fabricated with a metal oxide dielectric. It will be recognized by those skilled in the art and having the benefit of this disclosure that the present invention is applicable to the formation of both n-channel FETs (NFETs) and p-channel FETs (PFETs).

An advantage of embodiments of the present invention is that a MOSFET gate dielectric having a higher dielectric constant than silicon dioxide is formed.

A further advantage of embodiments of the present invention is that electron mobility in a MOSFET incorporating the metal oxide dielectric is improved by providing an intrinsic layer of epitaxial silicon subjacent the metal oxide gate dielectric layer.

A further advantage of embodiments of the present invention is that the higher dielectric constant of the metal oxide dielectric layer allows a MOSFET in accordance with the present invention to have equivalent electrical performance to a MOSFET with a physically thinner silicon dioxide gate dielectric layer.

The present invention may be implemented with various changes and substitutions to the illustrated embodiments. For example, the present invention may be practiced with not only with silicon wafers as substrates, but also with other substrates, including but not limited to such substrates as silicon on insulator (SOI).

It will be readily understood by those skilled in the art and having the benefit of this disclosure, that various other changes in the details, materials, and arrangements of the materials and steps which have been described and illustrated in order to explain the nature of this invention may be made without departing from the principles and scope of the invention as expressed in the subjoined Claims.

What is claimed is:

1. A field effect transistor (FET) comprising:
   a metal oxide gate insulator disposed over a substantially intrinsic layer of silicon on a silicon substrate.

2. The FET of claim 1, wherein the metal oxide comprises an oxide of hafnium.

3. The FET of claim 1, wherein the metal oxide comprises an oxide of zirconium.

4. The FET of claim 1, wherein the metal oxide is an oxide of a rare earth element that has a higher heat of formation than silicon dioxide.

5. The FET of claim 1, wherein the substantially intrinsic layer of silicon is an epitaxial layer.

6. The FET of claim 1, further comprising a gate electrode overlying the metal oxide layer; and source/drain terminals disposed in the substrate substantially adjacent the gate electrode.

7. The FET of claim 5, wherein the epitaxial layer has a thickness in the range of approximately 10 angstroms to 20 angstroms.

8. A field effect transistor (FET) comprising:
   a metal oxide gate insulator disposed over a substantially intrinsic layer of silicon which overlies a silicon substrate, wherein the substantially intrinsic layer of silicon is an epitaxial layer 9. The FET of claim 8, wherein the epitaxial layer has a thickness in the range of approximately 10 angstroms to 20 angstroms.

10. The FET of claim 8, wherein the metal oxide comprises an oxide of hafnium.

11. The FET of claim 8, wherein the metal oxide comprises an oxide of zirconium.

12. The FET of claim 8, wherein the metal oxide is an oxide of rare earth element that has a higher heat of formation than silicon dioxide.

13. The FET of claim 8, further comprising a gate electrode overlying the metal oxide layer; and source/drain terminals disposed in the substrate substantially adjacent the gate electrode.

14. A field effect transistor (FET) comprising:
 a high-k metal oxide gate insulator disposed over a substantially intrinsic layer of silicon which overlies a silicon substrate;
 a gate electrode overlying the metal oxide layer; and
 source/drain terminals disposed in the substrate substantially adjacent the gate electrode.

15. The FET of claim 14, wherein the metal oxide comprises an oxide of hafnium.

16. The FET of claim 14, wherein the metal oxide comprises an oxide of zirconium.

17. The FET of claim 14, wherein the metal oxide is an oxide of rare earth element that has a higher heat of formation than silicon dioxide.

18. The FET of claim 14, wherein the metal oxide is a metal that does not react with silicon to form a silicide.

19. The FET of claim 14, wherein the substantially intrinsic layer of silicon is an epitaxial layer.

20. The FET of claim 19, wherein the epitaxial layer has a thickness in the range of approximately 10 angstroms to 20 angstroms.

21. An apparatus, comprising:
 a single crystal silicon substrate;
 a substantially intrinsic layer of silicon on the single crystal silicon substrate;
 a metal oxide layer on the substantially intrinsic layer of silicon; and
 a polysilicon layer on the metal oxide layer.

22. The apparatus of claim 21 wherein the substantially intrinsic layer of silicon is epitaxial.

23. The apparatus of claim 21, wherein the polysilicon layer is a heavily doped gate electrode and further comprising source/drain terminals disposed in the substrate substantially adjacent the gate electrode.

24. The apparatus of claim 21, wherein the metal oxide layer comprises an oxide of hafnium.

25. The apparatus of claim 21, wherein the metal oxide layer comprises an oxide of zirconium.

26. The apparatus of claim 21, wherein the metal oxide layer is a high-k material.

* * * * *